United States Patent
Bell

(10) Patent No.: US 7,932,460 B2
(45) Date of Patent: *Apr. 26, 2011

(54) THERMOELECTRIC HETEROSTRUCTURE ASSEMBLIES ELEMENT

(75) Inventor: Lon E. Bell, Altadena, CA (US)

(73) Assignee: ZT Plus, Irwindale, CA (US)

( * ) Notice: Subject to any disclaimer, the term of this patent is extended or adjusted under 35 U.S.C. 154(b) by 1364 days.

This patent is subject to a terminal disclaimer.

(21) Appl. No.: 10/897,292

(22) Filed: Jul. 22, 2004

(65) Prior Publication Data

US 2004/0261829 A1    Dec. 30, 2004

Related U.S. Application Data

(63) Continuation of application No. 09/987,232, filed on Nov. 6, 2001, now Pat. No. 6,812,395.

(60) Provisional application No. 60/331,021, filed on Oct. 24, 2001.

(51) Int. Cl.
*H01L 35/08* (2006.01)
*H01L 37/00* (2006.01)

(52) U.S. Cl. .................................. 136/237; 136/201

(58) Field of Classification Search ............ 257/467; 136/205

See application file for complete search history.

(56) References Cited

U.S. PATENT DOCUMENTS

| | | | |
|---|---|---|---|
| 2,027,534 A | 1/1936 | Ingersoll | |
| 2,811,440 A | 10/1957 | Fritts et al. | |
| 2,811,571 A | 10/1957 | Fritts et al. | |
| 2,811,720 A | 10/1957 | Fritts et al. | |
| 2,882,468 A | 4/1959 | Wernick | |
| 2,944,404 A | 7/1960 | Fritts | |
| 2,949,014 A | 8/1960 | Belton, Jr. et al. | |
| 3,004,393 A | 10/1961 | Alsing | |
| 3,006,979 A | 10/1961 | Rich | |
| 3,071,495 A | 1/1963 | Hänlein | |
| 3,073,883 A | 1/1963 | McHugh et al. | |
| 3,129,116 A | 4/1964 | Corry | |
| 3,178,895 A | 4/1965 | Mole et al. | |
| 3,213,630 A | 10/1965 | Mole | |
| 3,224,876 A | 12/1965 | Fredrick | |
| 3,238,134 A | 3/1966 | Fleischmann | |
| 3,318,669 A | 5/1967 | Folberth | |
| 3,505,728 A * | 4/1970 | Neighbour et al. ........... 136/201 |
| 3,527,621 A | 9/1970 | Newton | |

(Continued)

FOREIGN PATENT DOCUMENTS

DE    101 42 624 A1    4/2003

(Continued)

OTHER PUBLICATIONS

Derwent abstract of Kushibiki et al. JP 2001-267642 A, patent published Sep. 28, 2001.*

(Continued)

*Primary Examiner* — Alex Noguerola

(74) *Attorney, Agent, or Firm* — Knobbe, Martens, Olson & Bear, LLP

(57) ABSTRACT

Improved thermoelectric assemblies are disclosed, wherein layers of heterostructure thermoelectric materials or thin layers of thermoelectric material form thermoelectric elements. The layers are bound together with agents that improve structural strengths, allow electrical current to pass in a preferred direction, and minimize or reduce adverse affects, such a shear stresses, that might occur to the thermoelectric properties and materials of the assembly by their inclusion.

42 Claims, 7 Drawing Sheets

U.S. PATENT DOCUMENTS

| | | |
|---|---|---|
| 3,527,622 A | 9/1970 | Angus et al. |
| 3,607,444 A | 9/1971 | DeBucs |
| 3,626,704 A | 12/1971 | Coe, Jr. |
| 3,635,037 A | 1/1972 | Hubert |
| 3,663,307 A | 5/1972 | Mole |
| 3,681,929 A | 8/1972 | Schering |
| 3,779,814 A | 12/1973 | Miles et al. |
| 3,817,043 A | 6/1974 | Zoleta |
| 3,945,855 A | 3/1976 | Skrabek et al. |
| 4,038,831 A | 8/1977 | Gaudel et al. |
| 4,065,936 A | 1/1978 | Fenton et al. |
| 4,281,516 A | 8/1981 | Berthet et al. |
| 4,297,841 A | 11/1981 | Cheng |
| 4,420,940 A | 12/1983 | Buffet |
| 4,494,380 A | 1/1985 | Cross |
| 4,499,329 A | 2/1985 | Benicourt et al. |
| 4,608,319 A | 8/1986 | Croopnick et al. |
| 4,730,459 A | 3/1988 | Schicklin et al. |
| 4,731,338 A | 3/1988 | Ralston et al. |
| 4,905,475 A | 3/1990 | Tuomi |
| 4,989,626 A | 2/1991 | Takagi et al. |
| 5,006,178 A * | 4/1991 | Bijvoets ............... 136/211 |
| 5,038,569 A | 8/1991 | Shirota et al. |
| 5,092,129 A | 3/1992 | Bayes et al. |
| 5,097,829 A | 3/1992 | Quisenberry |
| 5,193,347 A | 3/1993 | Apisdorf |
| 5,228,923 A | 7/1993 | Hed |
| 5,232,516 A | 8/1993 | Hed |
| 5,385,020 A | 1/1995 | Gwilliam et al. |
| 5,429,680 A | 7/1995 | Fuschetti |
| 5,439,528 A * | 8/1995 | Miller ............... 136/200 |
| 5,448,109 A | 9/1995 | Cachy |
| 5,499,504 A | 3/1996 | Mill et al. |
| 5,584,183 A | 12/1996 | Wright et al. |
| 5,592,363 A | 1/1997 | Atarashi et al. |
| 5,594,609 A * | 1/1997 | Lin ............... 361/104 |
| 5,605,047 A | 2/1997 | Park et al. |
| 5,682,748 A | 11/1997 | DeVilbiss et al. |
| 5,726,381 A | 3/1998 | Horio et al. |
| 5,802,856 A | 9/1998 | Schaper et al. |
| 5,860,472 A | 1/1999 | Batchelder |
| 5,867,990 A | 2/1999 | Ghoshal |
| 5,900,071 A * | 5/1999 | Harman ............... 136/236.1 |
| RE36,242 E | 6/1999 | Apisdorf |
| 5,921,088 A | 7/1999 | Imaizumi |
| 5,955,772 A * | 9/1999 | Shakouri et al. ............... 257/467 |
| 5,959,341 A * | 9/1999 | Tsuno et al. ............... 257/467 |
| 5,966,941 A | 10/1999 | Ghoshal |
| 5,987,890 A | 11/1999 | Chiu et al. |
| 6,000,225 A | 12/1999 | Ghoshal |
| 6,013,204 A | 1/2000 | Kanatzidis et al. |
| 6,060,657 A | 5/2000 | Harman |
| 6,082,445 A | 7/2000 | Dugan |
| 6,084,172 A | 7/2000 | Kishi et al. |
| 6,096,966 A | 8/2000 | Nishimoto et al. |
| 6,103,967 A | 8/2000 | Cachy et al. |
| 6,225,550 B1 | 5/2001 | Hornbostel et al. |
| 6,274,802 B1 * | 8/2001 | Fukuda et al. ............... 136/201 |
| 6,282,907 B1 | 9/2001 | Ghoshal |
| 6,312,617 B1 | 11/2001 | Kanatzidis et al. |
| 6,319,744 B1 | 11/2001 | Hoon et al. |
| 6,334,311 B1 | 1/2002 | Kim et al. |
| 6,346,668 B1 | 2/2002 | McGrew |
| 6,347,521 B1 | 2/2002 | Kadotani |
| 6,366,832 B2 | 4/2002 | Lomonaco et al. |
| 6,367,261 B1 | 4/2002 | Marshall et al. |
| 6,401,462 B1 | 6/2002 | Bielinski |
| 6,412,287 B1 | 7/2002 | Hughes et al. |
| 6,444,894 B1 | 9/2002 | Sterzel |
| 6,446,442 B1 | 9/2002 | Batchelder et al. |
| 6,452,206 B1 | 9/2002 | Harman et al. |
| 6,477,844 B2 | 11/2002 | Ohkubo et al. |
| 6,481,213 B2 | 11/2002 | Carr et al. |
| 6,510,696 B2 | 1/2003 | Guttman et al. |
| 6,530,231 B1 | 3/2003 | Nagy et al. |
| 6,530,842 B1 | 3/2003 | Wells et al. |
| 6,539,725 B2 | 4/2003 | Bell |
| 6,560,968 B2 | 5/2003 | Ko |
| 6,563,039 B2 | 5/2003 | Caillat et al. |
| RE38,128 E | 6/2003 | Gallup et al. |
| 6,598,405 B2 | 7/2003 | Bell |
| 6,617,504 B2 | 9/2003 | Kajihara et al. |
| 6,625,990 B2 | 9/2003 | Bell |
| 6,637,210 B2 | 10/2003 | Bell |
| 6,672,076 B2 | 1/2004 | Bell |
| 6,812,395 B2 * | 11/2004 | Bell ............... 136/201 |
| 6,845,710 B2 | 1/2005 | Hinzpeter et al. |
| 6,858,154 B2 | 2/2005 | Suzuki et al. |
| 6,883,359 B1 | 4/2005 | Hartwig, Jr. |
| 6,948,321 B2 | 9/2005 | Bell |
| 6,959,555 B2 | 11/2005 | Bell |
| 7,111,465 B2 | 9/2006 | Bell |
| 7,231,772 B2 | 6/2007 | Bell |
| 7,273,981 B2 | 9/2007 | Bell |
| 7,326,851 B2 | 2/2008 | Sterzel et al. |
| 7,342,169 B2 | 3/2008 | Venkatasubramanian et al. |
| 7,365,265 B2 | 4/2008 | Heremans et al. |
| 7,426,835 B2 | 9/2008 | Bell |
| 7,465,871 B2 | 12/2008 | Chen et al. |
| 2001/0029974 A1 * | 10/2001 | Cohen et al. ............... 136/201 |
| 2002/0014261 A1 | 2/2002 | Caillat et al. |
| 2002/0139123 A1 | 10/2002 | Bell |
| 2002/0148234 A1 | 10/2002 | Bell |
| 2003/0029173 A1 | 2/2003 | Bell |
| 2003/0079770 A1 | 5/2003 | Bell |
| 2003/0094265 A1 | 5/2003 | Chu et al. |
| 2004/0200519 A1 | 10/2004 | Sterzel et al. |
| 2004/0261829 A1 | 12/2004 | Bell |
| 2004/0261833 A1 | 12/2004 | Ono et al. |
| 2005/0076944 A1 | 4/2005 | Kanatizidis et al. |
| 2005/0241690 A1 | 11/2005 | Tajima et al. |
| 2006/0102224 A1 | 5/2006 | Chen et al. |
| 2006/0249704 A1 | 11/2006 | Ren et al. |
| 2006/0272697 A1 | 12/2006 | Kanatzidis et al. |
| 2007/0107764 A1 | 5/2007 | Kanatzidis et al. |
| 2007/0227577 A1 | 10/2007 | Sterzel et al. |
| 2008/0289677 A1 | 11/2008 | Bell et al. |
| 2009/0178700 A1 | 7/2009 | Heremans et al. |
| 2009/0235969 A1 | 9/2009 | Heremans et al. |
| 2009/0269584 A1 | 10/2009 | Bell et al. |
| 2010/0258154 A1 | 10/2010 | Heremans |

FOREIGN PATENT DOCUMENTS

| | | |
|---|---|---|
| EP | 1 102 334 | 5/2001 |
| GB | 2 027 534 A | 2/1980 |
| GB | 2 267 338 A | 12/1993 |
| JP | 56-18231 | 2/1981 |
| JP | 4-165234 | 6/1992 |
| JP | 05219765 A | 8/1993 |
| JP | 09-074229 | 3/1997 |
| JP | 2000-164940 | 6/2000 |
| JP | 2002-289930 | 10/2002 |
| JP | 2003-225743 | 8/2003 |
| JP | 2008-523579 | 12/2006 |
| SE | 329 870 | 5/1969 |
| SE | 337 227 | 8/1971 |
| WO | WO 98/44562 | 10/1998 |
| WO | WO 00/24040 | 4/2000 |
| WO | WO 02/065030 A1 | 8/2002 |
| WO | WO 2004/090998 | 10/2004 |
| WO | WO 2005/036660 | 4/2005 |

OTHER PUBLICATIONS

McGraw Hill online Science dictionary "shearing stress" downloaded from www.accessscience.com on Aug. 2, 2010.*
PCT/US02/03654, Jun. 12, 2002, PCT Int'l. Search Report.
PCT/US02/06285, Jun. 12, 2002, PCT Int'l. Search Report.
PCT/US02/03659, Aug. 6, 2002, PCT Int'l. Search Report.
PCT/US02/03772, Jul. 11, 2002, PCT Int'l. Search Report.
PCT/US02/25233, Nov. 29, 2002, PCT Int'l. Search Report.
PCT/US03/17834, Sep. 2, 2003, PCT Int'l. Search Report.
Angrist, Stanley W., "Direct Energy Conversion," 32 Ed. Ally & Bacon (1976).
Bell, L.E., "Use of Thermal Isolation to Improve Thermoelectric System Operating Efficiency," Proc. 21$^{st}$ Int'l Conf. on Thermoelectrics, Long Beach, CA (Aug. 2002).

Bell, L.E., "Increased Thermoelectric System Thermodynamic Efficiency by Use of Convective Heat Transport," Proc. 21$^{st}$ Int'l Conf. on Thermoelectrics, Long Beach, CA (Aug. 2002).

Buist, R.J., et al., "A New Concept for Improving Thermoelectric Heat Pump Efficiency," Borg-Warner Thermoelectrics, Wolf and Algonquin Road.

Buist, R., et al., Theoretical Analysis of Thermoelectric Cooling Performance Enhancement Via Thermal and Electrical Pulsing, *Journal of Thermoelectricity*, No. 4 (1996).

Goldsmid, H.J., "Electronic Refrigeration," Pion. Ltd., 207 Brondesbury Park, London, NW2 5JN, England (1986).

Ikoma, K., et al., "Thermoelectric Module and Generator for Gasoline Engine Vehicles," 17$^{th}$ Int'l Conf. on Thermo-electrics, Nagoya, Japan, pp. 464-467 (1998).

Miner, A., et al., Thermo-Electro-Mechanical Refrigeration Based on Transient Thermoelectric Effects, *Applied Physics Letters*, vol. 75, pp. 1176-1178 (1999).

Tada, Shigeru, et al., "A New Concept of Porous Thermoelectric Module Using a Reciprocating Flow for Cooling/Heating System (Numerical Analysis for Heating System)," 16$^{th}$ Int'l Conf. on Thermoelectrics (1997).

PCT/US2004/026560 ISR, dated Aug. 16, 2004, BSST LLC.

*CRC Handbook of Thermoelectrics*, ed. D.M. Rowe, Chapter 54, *Medium-Scale Cooling: Thermoelectric Module Technology*, Jul. 1995, ISBN: 0-8493-0146-7.

PCT/US2004/026757 ISR dated Apr. 7, 2005, Mar. 3, 2005, BSST LLC.

PCT/US03/24899 ISR dated Apr. 5, 2004, Aug. 7, 2003, BSST, LLC.

Ahmad, S., et al.: "Ab initio studies of the electric structure of defects in PbTe" Physical Review B, vol. 74, 2006, pp. 155205-1-155205-13.

Akimov, B. A., et al.: "Carrier Transport and Non-Equilibrium Phenomena in Doped PbTe and Related Materials" Review Article, Department of Low Temperature Physics, Faculty of Physics, M.V. Lomonossov Moscow State University, phys. stat. sol. (a) 127, 9 (1993) (pp. 9-55).

Alekseeva, G. T., et al.: "Hole Concentration and Thermoelectric Figure of Merit for Pb1-xSnxTe: Te Solid Solutions," Semiconductors, Vo. 34, No. 8, 2000, pp. 897-901.

Androulakis, John et al.,: "Nanostructuring and High Thermoelectric Efficiency in p-Type Ag(Pb1-ySny) mSbTe2+m" Wiley InterScience, Advanced Materials, 2006, 18, 1170-1173, Wiley-VCH Verlag GmbH & Co. KGaA, Weinheim.

Armstrong, R. W., et al.: "A Structural Study of the Compound AgSbTe2", Journal of Applied Physics, vol. 31, No. 11, Nov. 1960, pp. 1954-1959.

Bazakutsa, V. A., et al.: "Thermal Conductivity of Triple Semiconductors of A1SbC$^6$ $_2$ Type as a Function of Chemical Composition and Structure", J. Eng. Phys. 34, 127-140 (1978).

Bell, L. E.: "Alternate Thermoelectric Thermodynamic Cycles with Improved Power Generation Efficiencies", Proceedings ICT '03, 22nd International Conference on Thermoelectrics, La Grande Motte, France, Aug. 17-21, 2003.

Bergmann, V. G.: "Untersuchungen über die Dotierungseigenschaften der Elemente Germanium und Blei in Wismuttellurid Bi2Te3★", Z. Ruer Naturforsch, vol. 18a, Issue 11, 1963, pp. 1169-1181.

Borissova et al., Thermoelectric properties of materials based on PbTe and GeTe, 1st Eur. Conf. Thermoelec., Cardiff, Sep. 15-17, Chapter 15, pp. 171-177 (1988).

Bushmarina, G. S., et al.: "Stabilization of the Fermi level in gallium-doped Pb1-x GexTe solid solutions", Sov. Phys. Semicond. 11(10), Oct. 1977, American Institute of Physics 1978, pp. 1098-1102.

Caillat, T. et al.: "Study of The Bi-Sb-Te Ternaru Phase Diagram", J. Phys. Chem. Solids vol. 53, No. 2, pp. 227-232, 1992.

Choi, J.-S. et al., "Thermoelectric Properties of n-Type (Pbl-xGex)Te Fabricated by Hot Pressing Method" Proc. 16th International Conference on Thermoelectrics, 228-231. (1997).

Darrow, M.S., et al.: "Phase Relations in the System PBS-PbTe", Transactions of the Metallurgical Society of AIME, 654-vol. 236, May 1996.

Database Inspec [Online] The Institution of Electrical Engineers, Stevenage, GB; May 16, 1993, Akimov, B. A., et al.: "Carrier transport and non-equilibrium phenomena in doped PbTe and related materials" XP002556261 Database accession No. 4449842 abstract & Physica Status Solidi A Germany, vol. 137, No. 1, 1993, pp. 9-55, ISSN: 0031-8965.

Derwent 2001-426994/46.

DeYoreo et al., Principles of Crystal Nucleation and Growth, Biomineralization, vol. 54, Weiner Mineralogical Society of America, pp. 57-93, 2003.

Dimmock, J. O., et al.: "Band Structure and Laser Action in PbxSn1-xTe" Physical Review Letters, vol. 16, No. 26, pp. 1193-1196, Jun. 27, 1996.

Dismukes, J.P. et al.: "Lattice Parameter and Density in Germanium-Silicon Alloys", RCA Laboratorie s, Radio Corporation of America, Princeton, New Jersey, vol. 68, No. 10, Oct. 1964, pp. 3021-3027.

Dudkin, L. Ts., et al.: "Three-way semiconducting connectors A1BvBv21," Presentations of USSR Academy of Sciences, 1950. vol. 154, No. 1, pp. 94-97.

Dughaish, Z. H.: "Lead telluride as a thermoelectric material for thermoelectric power generation", Physica B 322 (2002) 205-223.

Ebling, et al.: "Influence of Group IV-Te Alloying oj Nanocomposite Structure and Thermoelectric Properties of Bi2 Te3 Compounds", Journal of Electronic Materials, vol. 38, No. 7, 2009, pp. 1450-1455.

Fleischmann, V. H., et al.: "Halbleitende Mischkristalle vom Typ", Z. Naturforschg. 14a, 999-1000 (1959); eingeg. am Oct. 8, 1950).

Fleischmann, V. H., et al.: "Neuere Untersüchungen an halbleitenden IV VI-IVI2-Mischkristallen", Z. Naturforschg. JBa, 646-649 (1963); eingegangen am Mar. 9, 1963).

Gelbstein Y., et al.: "In-doped Pb0.5Sn0.5Te p-type samples prepared by powder metallurgical processing for thermoelectric applications" Physica B, vol. 396, Jan. 1, 2007 pp. 16-21.

Geller, S., et al.: "Ternary Semiconducting Compounds with Sodium Chloride-Like Structure: AgSbSe2, AgSbTe2, AgBiS2, AgBiSe2", Ternary Semiconducting Compounds, Acta Cryst. (1959) 12, pp. 46-54.

Golubev, V. G., et al.: "Electrical properties of Pb1-xlnxTe solid solutions at liquid helium temperature", Sov. Phys. Semicond. 11(9) Sep. 1977, American Institute of Physics 1978, pp. 1001-1003.

Goodman, C.H.L., et al.: "New Semiconducting Compounds of Diamond Type Structure", Research Laboratories The General Electric Co. Ltd., Wembley, Middlesex, England, Physica XX, No. 11, Amsterdam Conference Semiconductors (1954) pp. 1107-1109.

Guéguen, A., et al.: "Thermoelectric Properties and Nanostructuring in the p-Type Materials NaPb18-xSnxMTe20 (M=Sb, Bi)", Chem. Mater. 2009, 21, 1683-1694 American Chemical Society.

Heremans, et al.: "Thermopower enhancement in PbTe with Pb precipitates", Journal of Applied Physics 98, 063703 (2005).

Heremans, J. P., et al.: "Enhancement of Thermoelectric Efficiency in PbTe by Distortion of the Electric Density of States", Science 321, 554 (2008), in six pages.

Hoang, Khang, et al.: "Atomic Ordering and Gap Formation in Ag-Sb-Based Ternary Chalcogenides" Physical Review Letters, American Physical Society, New York, US, vol. 99, No. 15, Oct. 12, 2007 pp. 156403-1, ISSN: 0031-9007.

Hockings, E.F.: "The thermal conductivity of silver antimony telluride", Letters to the Editors, 1959, pp. 341-342.

Hsu, K.F., et al.: "Cubic AgPbmSbTe2+m: bulk thermoelectric materials with high figure of merit" Science, vol. 303, Feb. 6, 2004, pp. 818-821.

Hsu, K.F., et al.: "Thermoelectric Properties of the cubic AgPb10SbTe12" Mat. Res. Soc. Symp. Proc. vol. 793, 2004 Materials Research Society, pp. S6.3.1-S6.3.6.

Jaworski, C. M., et al.: "Resonant level formed by tin in Bi2Te3 and the enhancement of room-temperature thermoelectric power", Physical Review B 80, 1 (2009), pp. 1-1 to 1-4.

Jovovic, V., et al.: "Low temperature thermal, thermoelectric and thermomagnetic transport in indium rich Pb1-xSnxTe alloys", The Ohio State University, Columbus, OH 43210, USA, J. of Applied Physics (103) 053710 (2008), in 7 pages.

Jovovic, V., et al.: High-Temperature Thernoelectric Properties of Pb1-xSnxTe:In, Mater. Res. Soc. Symp. Proc. vol. 1044, 2008.

Kaïdanov, V. I., et al.: "Deep and resonance states in AIVBVI semiconductors", Sov. Phys. Usp. 28(1), Jan. 1985, American Institute of Physics 1985, pp. 31-53.

Kaĭdanov, V. I., et al.: "Influence of resonant scattering of carriers on the transport coefficients in the absence of a magnetic field", Sov. Phys. Semicond. 20(6), Jun. 1986, American Institute of Physics 1986, pp. 693-694.

Kaĭdanov, V. I., et al.: "New quasilocal level in PbTe:TI containing excess lead", Sov. Phys. Semicond. 20(5), May 1986, American Institute of Physics 1986, pp. 541-543.

Kaĭdanov, V. I., et al.: "Resonant scattering of carriers in IV-VI semiconductors", Sov. Phys. Semicond. 26(2), Feb. 1992, American Institute of Physics 1992, pp. 113-125.

Kohler, H.: "Non-Parabolicity of the Highest Valence Band of Bi2Te3 from Shubnikov-de Haas Effect". Physikalisches Institut der Universtat Wurzburg, phys. stat. sol (b) 74, 591 (1976) pp. 591-600.

Kohri H., et al., "Improvement of thermoelectric properties for n-type PbTe by adding Ge" Materials Science Forum Trans Tech Publications Switzerland, vol. 423-425, 2003, pp. 381-384.

Kudman, I.: "Thermoelectric properties of p-tupe PbTe-PbSe alloys", Journal of Materials Science 7 (1972) 1027-1029.

Kulbachinskii, V. A., et al.: "Thermoelectric Power and Scattering of Carriers in Bi2-xSnxTe3 with Layered Structure", phys. Stat. sol. (b) 199, 505 (1997).

Kulbachinskii, V. A., et al.: "Valence-band energy spectrum of solid solutions of narrow-gap-semiconductor Bi2-xSxTe3 single crystals", Physical Review B, vol. 50, No. 23, Dec. 15, 1994, pp. 16921-16930.

Kulbachinskiĭa, et al.: "Fermi Surface and Thermoelectric Power of (Bi1-xSBx)2Te3<Ag,Sn> Mixed Crystals", in Fizika Tverdogo Tela, 2006, vol. 48, No. 5, pp. 594-601.

Kullerud, The Lead Sulfur System, American Journal of Science, Schairer vol. 267-A, pp. 233-256, 1969.

Lalonde, A.D., et al.: "Synthesis and Characterization of p-Type Pb0.5 Sn0.5Te Thermoelectric Power Generation Elements by Mechanical Alloying," Journal of Electronic Materials, vol. 39, No. 1, 2010.

Lashkaraev G. V., et al., "Hot wall growth and properties of lead telluride films doped by germanium and gallium" Semiconductor Physics Quantum Electronics & Optoelectronics Natl. Acad. Sci. UKR Ukraine, vol. 3, No. 3, Jun. 2000, pp. 295-299, Ukraine ISSN: 1560-8034.

Lawson et al., Preparation and properties of HgTe and mixed crystals of Hg Te-CdTe, Phys. And Chem. Solids, 9, pp. 325-329 (1959) ( 1 page abstract only).

Long, C., et al: "Preparation and thermoelectric properties of N-type PbTe doped with In and PbI2" Rogl, P. F.,: 25th International Conference on Thermoelectrics, Aug. 6-10, 2006 (IEEE Cat. No. 06TH8931C) Piscataway, NJ, USA ISBN 1-4244-0811-3, Aug. 10, 2006, p. 382-385.

Mahan, G. D., et al.: "The best thermoelectric", Proc. Natl. Acad. Sci. USA, vol. 93, pp. 7436-7439, Applied Physical Sciences, Jul. 1996.

Matsushita, et al.: "Phase diagram and thermoelectric properties of Ag 3-xSb1+xTe4 system", Journal of Materials Science 39 (2004) 6299-6301.

Middendorf von, A., et al.: "Evidence for a Second Valence Band in p-Type Bi2 Te3 From Magneto-Seebeck and Shubnikov-De Haas-Data", Physikalisches Institut der universität Würzburg, Würzburg, Germany, Mar. 30, 1972, in five pages.

Miyajima, N., et al.: "Possible Mechanism of a New Type of Three-Dimensional Quantized Hall Effect in Layered Semiconductors Bi2-xSnxTe3", Journal of Low Temperature Physics, Vo. 123, Nos. ¾, 2001, pp. 219-238.

Morelli, et al., "Intrinsically Minimal Thermal Conductivity in Cubic I-V-VI2 Semiconductors", Physical Review Letters, PRL 101, 035901, 2008, in 4 pages.

Nemov, S. A. et al.: "Density of Localized States in (Pb0.78Sn 0.22) 0.95In0.05Te Solid Solutions", Electronic and Optical Properties of Semiconductors, Semiconductors, vol. 35, No. 10, 2001, pp. 1144-1146.

Nemov, S. A., et al.: "Characteristics of the energy spectrum of Pb1-xSnx Te:TI:Na" M. I. Jalinin Polytechnic Institute Leningrad, Sov. Phys. Semicond. 24(8), Aug. 1990, pp. 873-876.

Nemov, S. A., et al.: "Self-compensation of electrically active impurities by intrinsic defects in (Pb0.8Sn0.2) Te solid solutions" State Technical University, St. Petersburg, A.F. loffe Physicotechnical Institute, Russian Academy of Sciences, St. Petersburg, Sov. Phys. Semicond. 26(8), Aug. 1992, pp. 839-842.

Nemov, S. A., et al.: "Transport phenomena in Pb0.78Sn0.22Te with high in impurity concentrations", Semiconductors 27(2), Feb. 1993, American Institute of Physics 1993, pp. 165-168.

Orihashi, M., et al.: "Effect of tin content on thermoelectric properties of p-type lead tin telluride," Journal of Physics and Chemistry of Solids 61 (2000) 919-923.

Partin, D.L., "Growth of lead-germanium-telluride thin film structures by molecular beam epitaxy" J. Vac. Sci. Technol., 21(1), May/Jun. 1982, p. 1-5.

Plecháček, T., et al.: "Defect structure of Pb-doped Bi2Te3 single crystals", Philosophical Magazine, vol. 84, No. 21, Jul. 21, 2004, pp. 2217-2227.

Poudeu, P. F., et al.: "High temperature figure of merit and naostructuring in bulk p-type Na1-xPbmSbyTem+2" vol. 45, 2006, pp. 3835-3839.

Quarez, Eric et al., "Nanostructuring, Compositional Fluctuations, and Atomic Ordering in the Thermoelectric Materials AgPbmSbTe2+m. The Myth of Solid Solutions" Journal of the American Chemical Society, American Chemical Society, Washington, DC, US, vol. 127, Jan. 1, 2005 pp. 9177-9190, ISSN:0002-7863.

Ravich et al., "Semiconducting Lead Chalcogenides," Chap. IV, Sec. 4.2, pp. 196-213, 1970.

Ravich, Y. I., et al.: "Applications of Lead Chalcogenides", Semiconducting Lead Chalcogenides, 1970 Chapter VII, Sec. 7.1, pp. 328, 329.

Ravich, Y. I., et al.: "Selective Carrier Scattering in Thermoelectric Materials", General Principles and Theoretical Considerations, CRC Press, Inc. pp. 67-73, 1995.

Rogacheva, E. I., et al., "Concentration anomalies of properties in Pb1-xGexTe solid solutions" XP002296049 Database accession No. 4554393 abstract & XXII International School on Physics of Semiconducting Compounds May 22-28, 1993 Jaszowiec, Poland, vol. 84, No. 4, May 22, 1992, pp. 729-732, Acta Physica Polonica A Poland ISSN: 0587-4246 (The Institution of Electrical Engineers, Stevenage, GB; Oct. 1993.

Rosi, F. D., et al.: "Semiconducting materials for thermoelectric power generation" RCA Review, vol. 22, Mar. 1, 1961, pp. 82-121, RCA Corporation, US ISSN: 0033-6831.

Scherrer, H., et al.: "Thermoelectric Materials", Bismuth Telluride, Antimony Telluride, and Their Solid Solutions, Chapter 19, pp. 211-255, 1995.

Shamsuddin et al.: "Thermodynamic and Constitutional Studies of the Pb Te-GeTe System", Journal of Materials Science, vol. 10, pp. 1849-1855, 1975.

Shoemake, G. E., et al.: "Specific Heat of n- and p-Type Bi2Te3 from 1.4 to 90° K★", Physical Review, vol. 185, No. 3, Sep. 15, 1969, pp. 1046-1056.

Stambaugh, et al.: "Final Summary Report on Development on Improved Thermoelectric Materials for Spacegraft Applications", Battelle Memorial Institute, Contract No. NAS8-11452, Control No. DCN 1-4-50-01159-01 & S1 (1F), dated Jun. 25, 1965.

Veĭs, A. N., et al.: "Investigation of the impurity states of thallium lead selenide", Sov. Phys. Semicond., vol. 11, No. 5, May 1977, American Institute of Physics 1977, pp. 588-589.

Volkov, B. A., et al.: "Mixed-valence impurities in lead telluride-based solid solutions", Physics-Uspekhi 45 (8) 819-846 (2002), Uspekhi Fizicheskikh Nauk, Russian Academy of Sciences 2002.

Wernick, J. H., et al.: "New semiconducting ternary compounds", Phys. Chem. Solids 3, Letters to the Editor, 1957, pp. 157-159.

Wernick, Metallurgy of some ternary semiconductors and constitution on the AgSbSe2-AgSbTe2-AgBiSe-PbSe-PbTe system, Bell Telephone Laboratories, Inc., Murray Hill, New Jersey, pp. 69-88 (1960).

Wolfe, R., et al.: "Anomalous Hall Effect in AgSbTe2", Journal of Applied Physics, vol. 31, No. 11, Nov. 1960, pp. 1959-1964.

Wood, C., et al.: "Review Article; Materials for thermoelectric energy conversion" Reports on Progress in Physics, Institute of Physics Publishing, Bristol, GB, vol. 51, No. 4, Apr. 1, 1988 pp. 459-539, ISSN: 0034-4885 pp. 496,499.

Zhitinskaya, M. K., et al.: "Influence of Sn Resonance States on the Electrical Homogeneity of Bi2Te3 Single Crystals", Semiconductors, vol. 34, No. 12, 2000, pp. 1363-1364.

Zhitinskaya, M. K., et al.: "Properties of the Electron and Phonon Sub-systems of Tin-doped Bismuth Telluride-based Solid Solutions", 7th European Workshop on Thermoelectrics, 2002, Pamplona, Spain, 5 pages.

Zhitinskaya, M. K., et al.: "Specific features of Bi2Te3 doping with Sn", Physics of the Solid State, vol. 40, No. 8, Aug. 1998, pp. 1297-1300.

Zhitinskaya, M. K., et al.: "Thermal Conductivity of Bi2Te3 : Sn and the Effect of Codoping by Pb and I Atoms", Physics of the Solid State, vol. 45, No. 7, 2003, pp. 1251-1253.

Zhuze, V. P., et al.: "Semiconducting Compounds With the General Formula ABX2", Soviet Physics, Technical Physics, vol. 3, No. 10, Oct. 1958, pp. 1925-1938.

* cited by examiner

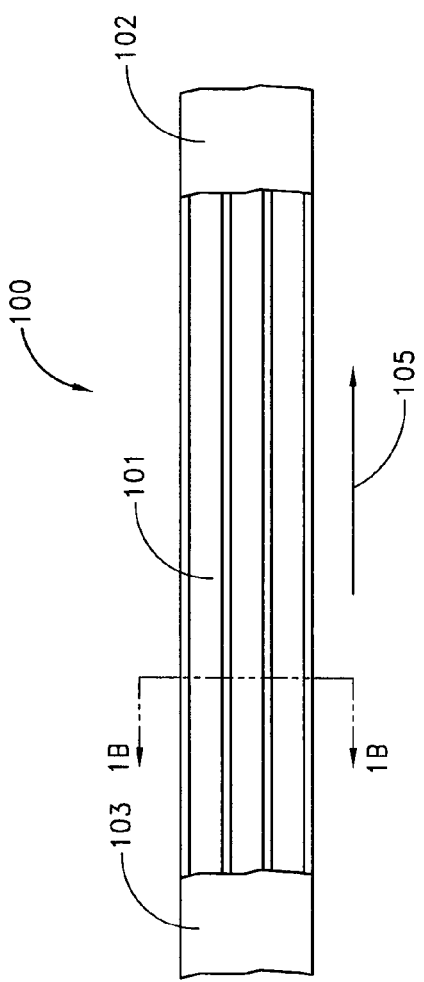
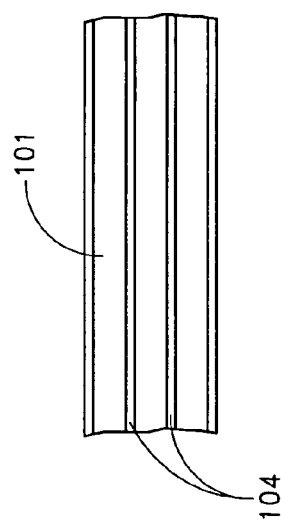

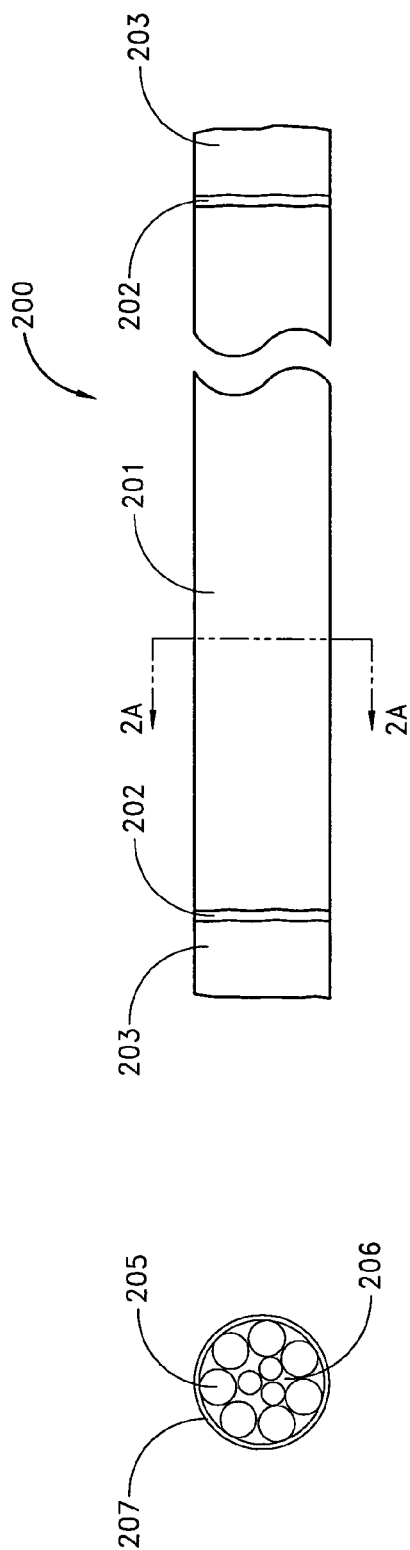

THERMOELECTRIC HETEROSTRUCTURE ASSEMBLIES ELEMENT

CLAIM OF PRIORITY

This application is a continuation of U.S. application Ser. No. 09/987,232, filed Nov. 6, 2001, now U.S. Pat. No. 6,812,395, which claims the benefit of U.S. Provisional Application No. 60/331,021, filed Oct. 24, 2001.

BACKGROUND OF THE INVENTION

1. Field of the Invention

The following disclosure relates generally to thermoelectrics configured from heterostructures or thin layers of thermoelectric material to improve performance or usability of such thermoelectrics.

2. Description of the Related Art

The bulk properties of thermoelectric (TE) materials can be altered if the materials are formed from very thin films or segments of alternating materials. The resultant assemblies formed of segments of such thin films are usually called heterostructures. Each film segment is the order of tens to hundreds of angstroms thick. Since each segment is very thin, multiple segments are needed to fabricate cooling, heating and power generating devices. The shape, dimensions and other geometrical characteristics of conventional heterostructures often make attachment of suitable thermal heat transfer members and electrodes to the individual heterostructures assembly difficult. Further complications arise, in the extraction of thermal power from the structures. New fabrication techniques, material combinations, and forming methods are required to fabricate TE elements from such materials. New fabrication techniques are even more critical for systems made from thousands of segments since materials formed of many segments tend to be fragile and weakened by (1) internal stresses that result from fabrication, (2) the very nature of the materials and (3) internal weakness caused by contamination and process variation. Further, certain TE materials, such as those based on Bismuth/Tellurium/Selenium mixtures, are inherently mechanically weak and hence, fragile in heterostructure form.

Heterostructure TE materials generally are configured to be long in one dimension (e.g., wires) or two dimensions (e.g., plates). The TE materials are usually anisotropic with varying thermal, electrical, and mechanical properties along different axes. Electric current either flows parallel to a long dimension or perpendicular to the long dimension(s). In TE elements where the current flows parallel to the long dimension, the length can range up to thousands of times the thickness or diameter of the material. To achieve the desired performance, such TE elements can be made of a multiplicity of heterostructure wires or plates.

SUMMARY OF THE INVENTION

Various embodiments using heterostructures in forming thermoelectric elements are disclosed. The heterostructures are constructed with layers of bonding and/or intermediate materials that add strength and/or improve manufacturability of completed thermoelectric elements formed of the heterostructures. In addition, the bonding and intermediate materials are used in various manners to facilitate or enhance the operation of thermoelectric assemblies. The thickness of the intermediate and bonding materials take into account the desired thermal and electrical characteristics and attributes for the particular configuration or application. Both the thermal conductivity and thermal conductance can be taken into account, in considering the thickness of each bonding and intermediate material.

Several configurations for thermoelectrics are described. One configuration involves a thermoelectric element that has at least two heterostructure thermoelectric portions of the same conductivity type (such as N-type or P-type). It should be noted that the use of the term "same conductivity type" in this configuration does not mean that these portions need to be of the same material, nor doping concentration. An electrically conductive material is coupled to the thermoelectric portions to form at least one electrode.

Preferably, the heterostructure thermoelectric portions form layers in the thermoelectric element, and the electrically conductive material is coupled to at least one of the layers at at least one end of the layers. Preferably, the conductive material couples to all or substantially all of the layers, where the electrode is an end electrode. Alternatively, the electrically conductive material may be coupled to at least the top or bottom of the layers.

In one configuration, the heterostructure thermoelectric portions form wires or a wire bundle, and the electrically conductive material forms at least one electrode at the end of the wire bundle. Preferably, an electrode is provided for each end. Alternatively, the electrically conductive material is coupled to at least the top or bottom of the wire bundle, or separate electrodes are provided for the top and bottom of the wire bundle.

In one example, a bonding material is between the at least two heterostructure thermoelectric portions. The bonding material is advantageously configured to reduce the power density or the shear stress in the element, or both.

An intermediate material may also be provided between the heterostructure thermoelectric portions and respective electrodes. Advantageously, the intermediate material is configured to reduce shear stress in the heterostructure thermoelectric portions when the thermoelectric element is operated. For example, the intermediate material may be resilient.

In one example, the heterostructure thermoelectric portions are of substantially the same thermoelectric material. The heterostructure thermoelectric portions may also be constructed of at least two layers of heterostructure thermoelectric material.

Another example of a thermoelectric element described has at least two layers of substantially the same thermoelectric material of the same conductivity type. At least one electrically conductive material is coupled to the thermoelectric material to form at least one electrode. In one form, the electrically conductive material is coupled to the layers at at least one end of the layers. Preferably, an electrode is provided at at least two ends. Alternatively, the electrically conductive material is coupled to at least the top or bottom of the layers, forming top and bottom electrodes. The layers may also form wires, with the electrodes coupled to the wires at at least one end of the wires, or coupled to at least the top or bottom of the wires.

In this example, a bonding material may also be provided between the at least two layers. Advantageously, the layers and the bonding material are configured to reduce the power density of the thermoelectric. The layers and the bonding material may be configured to reduce shear stress as an alternative, or in addition to, reducing the power density.

An intermediate material may also be provided between at least one electrode and at least one layer of the thermoelectric material. Preferably, the intermediate material is also configured to reduce shear stress in the layers. In one configuration, the intermediate material is resilient.

The at least two layers may also be heterostructures, as with the previous example. The heterostructures themselves may be made from at least two layers of heterostructure thermoelectric material.

Also disclosed is a method of producing a thermoelectric device involving the steps of layering at least two heterostructure thermoelectric segments, and connecting at least one electrode to the segments to form at least one thermoelectric element.

The step of layering may comprise bonding the at least two heterostructure thermoelectric segments with a bonding material. A further step of providing an intermediate material between at least one of the at least two heterostructure thermoelectric segments and at least one electrode may be used.

Preferably, the layers and/or the bonding and/or intermediate materials are configured to decrease power density. One or another, or all, may be configured to reduce shear stress as well, and/or reducing the power density.

Another method of producing a thermoelectric device involves the steps of forming at least two layers of substantially the same thermoelectric material, and connecting at least one electrode to at least one of the layers. Preferably, the step of forming involves bonding the at least two layers with a bonding material.

Advantageously, as mentioned above, the bonding material is configured to decrease power density and/or shear stresses. Similarly, an intermediate layer may be provided between the layers and the electrodes.

BRIEF DESCRIPTION OF THE DRAWINGS

FIG. 1 illustrates a thermoelectric element constructed of thermoelectric heterostructures.

FIG. 2 illustrates a thermoelectric wire bundle assembly.

DETAILED DESCRIPTION OF THE PREFERRED EMBODIMENT

Figure 3:
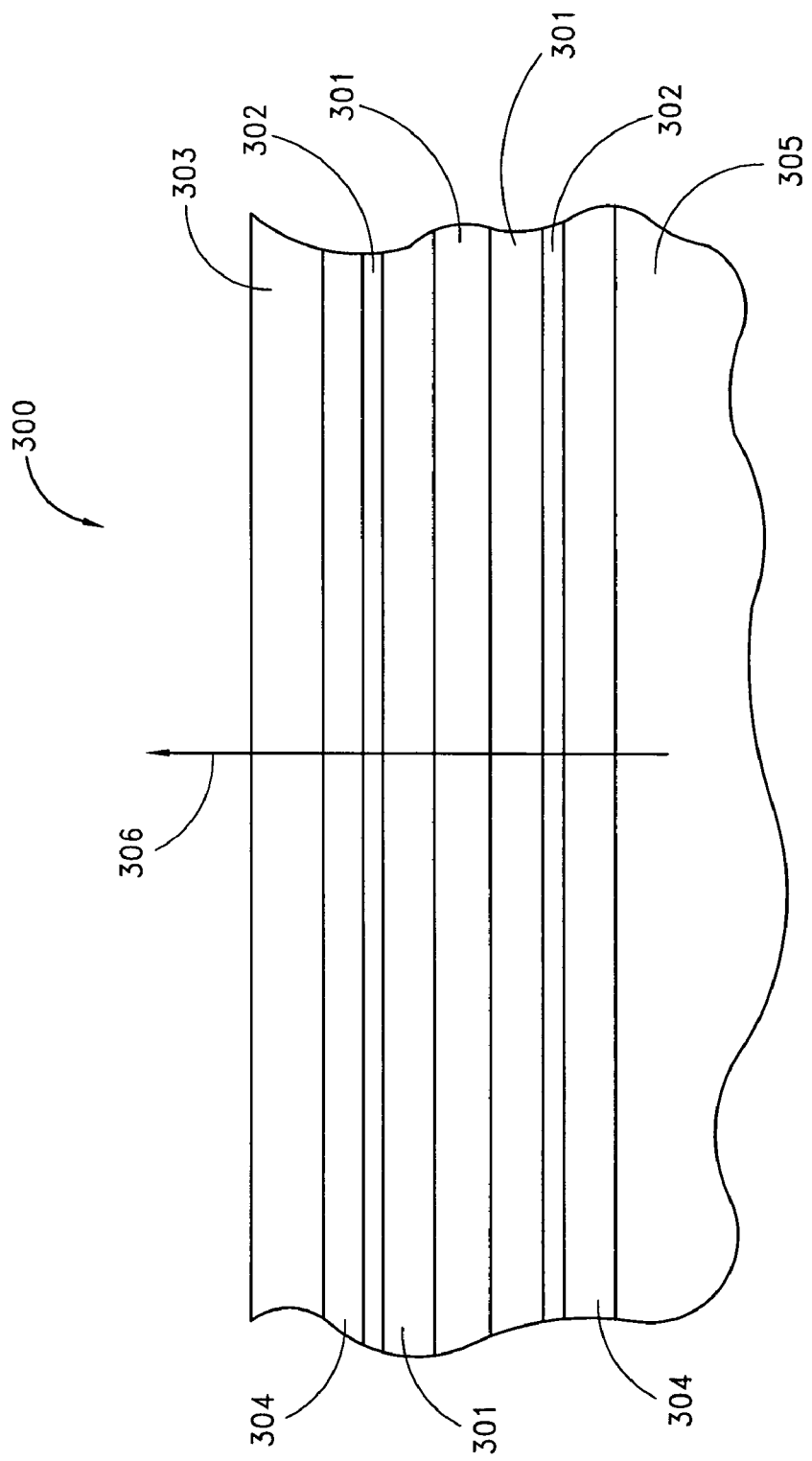
FIG. 3 illustrates a portion of a thermoelectric element.

Several embodiments of thermoelectrics are disclosed where layers of heterostructure thermoelectric materials or thin layers of thermoelectric material form a thermoelectric element. Advantageously, the layers are of the same conductivity type (N-type or P-type) for each thermoelectric element. In one embodiment, the layers are of the same, or at least substantially the same, thermoelectric material. Where the layers are heterostructures, the heterostructures themselves may be formed of layers of thermoelectric material. The layers may be bound together with agents that improve structural strength, allow electrical current to pass in a preferred direction, and minimize adverse effects that might occur to the thermoelectric properties of the assembly by their inclusion. Fabrication of useful TE systems requires a careful understanding of the TE materials' individual properties, such as thermal conductivity, electrical conductivity, coefficient of thermal expansion, properties over the processing and operating temperature ranges, and long-term stability. Often properties associated with other materials used in assembly of TE elements also can affect performance. Often interfacial diffusivity, work function, bond strength and the like are characteristics that arise from the use of combinations of materials and can affect performance.

In systems where the preferred direction of current flow is parallel to a long dimension (e.g., along a bundle of wires or along the long direction of plates), a bonding material for the heterostructures or thermoelectric layers advantageously has low thermal and electrical conductivity, high adhesive strength, and stable general properties that do not change during use.

For systems where the current flows perpendicular to the long dimensions, such as through heterostructures or thermoelectric material layers forming plates, preferred binding agents have high electrical conductivity so that electric current passes through the material with little resistive loss. Preferably, this is achieved by the binding agent wetting the TE materials' surfaces either directly, or through the use of an intermediate compatible wetting agent. Advantageous binding agents also do not degrade the performance of the resultant system either by requiring high fabrication temperatures that could cause diffusion in the TE heterostructure or promote degradation with time through diffusion, ionic exchange, corrosion or other mechanisms. FIG. 1 depicts a TE 100 constructed of TE heterostructure plates 101 terminated at each end with electrodes 102, 103. The layered plates 101 are assembled with a bonding material 104. The TE 100 may make up one leg or element of a TE module, and is either N or P conductivity type TE material. Generally, many such TE elements are arrayed so that current 105 flows alternately between N and P type materials, with electrodes 102 and 103 making part or all of the current flow path between TE elements 100.

At a first interface between the electrode 102 and the TE plates 101, thermal energy, for example, is removed and at the second interface between other electrode 103 and the TE plates 101 in this example, thermal energy is absorbed. Thus, electrode 102 is cooled and electrode 103 is heated. In normal heating or cooling operation, the heated electrode 103 is hotter than the cooled electrode 102 so that heat flows from electrode 103 to electrode 102. In power generation operation, a temperature gradient applied across the electrodes causes current to flow. Advantageously, the properties of the TE plates 101 and bonding material 104, the current 105 and the overall dimensions are chosen to minimize the combination of the resultant conductive heat loss and Joule heating from the current 105 passing through the TE element 100 so as to maximize cooling or thermoelectric efficiency, or power generation as is known in the art.

The bonding material 104 attaches the thin TE plates 101 into a slab that can be further processed (i.e., to connect electrodes 102 and 103 with greater ease). Note, however, the bonding material 104 conducts heat and thereby degrades the overall performance of the TE element 100. Advantageously, therefore the bonding material 104 should have poor thermal conductivity. It could be an unfilled epoxy and should be in as low a proportion as possible to the TE plates 101. Further it should not degrade with time, and should not reduce in other ways the TE system's thermal performance. Similarly, the bonding material 104 should not conduct electrical current to the extent that such conductance measurably increases Joule heating or causes current to bypass the TE plates 101. However, it is noted that some degree of electrical conductivity in the bonding material 104 can be of benefit in assemblies as noted below in connection with the description of FIG. 7.

FIG. 2 depicts a TE element 200 in which the end electrodes 203 and TE wires 205 or wire bundle are in contact with an intermediate conductor 202. The wire assembly 201 has a bonding material 206 and a sheath 207 around the wire bundle 205.

The considerations that relate to efficiency and performance of this configuration are the same as those for the TE element 100 of FIG. 1. Thus, advantageously, the bonding material 206 should have low thermal conductivity and either be an electrical insulator or be of low electrical conductivity. Preferably, the sheath 207 should have very low thermal and electrical conductivity.

The intermediate conductor material 202 serves to assure uniform, very low electrical and thermal resistance between the TE wires 205 and the electrodes 203. Advantageously, it makes uniform electrical and mechanical connections to every wire. In some configurations, where electrically conductive bonding material 206 is appropriate, the intermediate material 202 makes electrical contact with the bonding material 206 as well. The intermediate material 202 can be applied by vapor deposition, sputtering, plating or any other process that forms a suitable electrical and mechanical connection. In addition, the intermediate material 202 can be a solder that wets the wire 205 ends, can be conductive adhesive, can be a flexible or otherwise resilient material that is maintained under compressive force to provide electrical continuity or any other suitable electrical connection mechanism. Further, the intermediate material 202 can itself be made of more than one material. For example, a first layer could be nickel sputtered onto the wires at their ends, and a second layer of tin plating for solderability. A copper electrode 203 could have a copper flash and gold plating for solderability. Finally these two assemblies could be bonded together with solder to form the complete terminator of the assembly 200.

Similarly, the sheath 207 could be multi-layered. For example, it could consist of an inner conformal coating covered by a solid or mesh outer layer. It could serve any of several mechanical purposes, such as providing the mechanical attachment to maintain compressive forces on electrodes 202 as described above. Alternately, the sheath 207 could be omitted altogether as in the design in FIG. 1.

The bonding material 206 could be omitted as well, or it could only partially fill the voids so as to have air or vacuum spaced within the assembly. It could be a coating applied to the outer surface of the wires 205 and then sintered or pressed, so as to electrically connect and/or mechanically hold the wires 205 in the desired final configuration.

Finally, the electrodes 203 could be placed on the top and/or bottom of the wires rather than forming end electrodes.

FIG. 3 depicts a portion of a TE element 300 that has a lower electrode 305, an intermediate conductor material 304, a first diffusion barrier 302 and TE material 301, in plate form. The TE material 301 is depicted as three layers for convenience; in actual TE elements it could be of any number of layers and could have bonding materials (not shown) between the layers as in FIG. 1, to electrically and uniformly connect them. (Alternatively, a material constituent of the heterostructure TE material 301 itself would make the connection if the assembly were suitably processed (such as with heat and pressure). A second diffusion barrier 302 attaches to another intermediate material 304, which attaches to an upper electrode 303. In the example, a current 306 passes from the lower electrode 305 through, the layer and to the upper electrode. Since current passes through the intermediate material 304 and the diffusion barriers 302, advantageously, both are of high electrical and thermal conductivity since the materials are in series with the TE material 301. Thus, the criterion is the same as for the intermediate material 202 of FIG. 2, but the opposite of the bonding material 104 and 206 of FIGS. 1 and 2.

Figure 4:
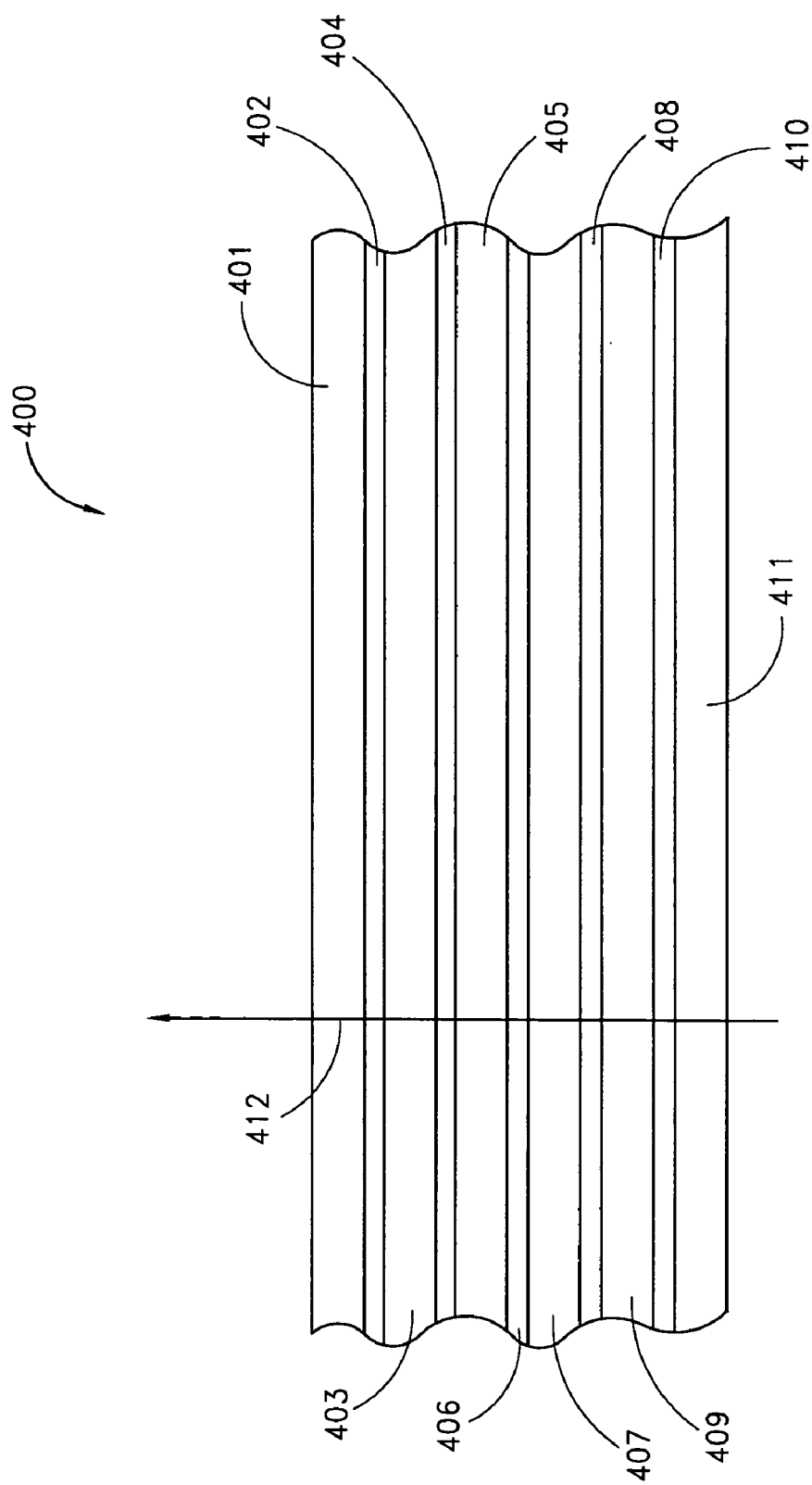
FIG. 4 illustrates thermoelectric element assembly of heterostructures.

FIG. 4 depicts a portion of a TE element 400. A first portion consists of an upper electrode 401, an intermediate material 402, TE material 403, an intermediate material 404 and a lower electrode 405. The second TE element consists of an upper electrode 407, and intermediate material 408, TE material 409, an intermediate material 410 and a lower electrode 411. Solder 406 or other conductive material is between the lower electrode 405 and the upper electrode 407.

As an example of operation, current 412 passes from the lower electrode 411 through the TE assembly 400 to the upper electrode 401. In this embodiment of the invention, two TE portions both of either N or P conductivity type TE material of the general type of FIG. 3 are connected in series by an intermediate material such as solder 406. This can be done for any of three principal purposes: (1) reduce the power per unit area produced by the assembly; (2) reduce thermal shear stresses; and (3) make the assembly thicker and more rugged. The first purpose is important since costs of fabricating heterostructure TE material increase substantially as the number of layers increases. Furthermore, added layers increase fabrication complexity and reduce yields.

It is important to have the ability to adjust power levels to meet the demands of particular applications. If all else is equal, power density is inversely proportional to TE material thickness. Since heterostructures are most easily made thin, power densities can be over 700 watts/square centimeter, which is hundreds of times more than that of typical TE modules fabricated from bulk materials. The high heat fluxes that can result can be difficult to transport without substantial losses. As a result, TE performance can be reduced so as to partially or completely negate the higher intrinsic TE performance of the heterostructures. By fabricating devices from multiple heterostructures, the TE material is thicker and power density can be reduced. TE performance is reduced by the electrical and thermal resistivity of the intermediate materials, electrodes, solder and other materials in electrical series with the TE material, but such losses are minimized advantageously by careful choice of the materials and how they are mated together. Thermal shear stresses are reduced by making the physical distance between the cold electrode and the hot electrode larger, using multiple layers of the heterostructures, and by choosing materials throughout the assembly that have low coefficients of thermal expansion. Also, stresses can be reduced by utilizing intermediate materials that flex easily, such as conductive rubbers, or materials that contain fluids, conductive greases, mercury, other conductive liquids, and any other material that so that they do not transmit significant shear stresses.

The third purpose of increased thickness is to make the assembly more rugged so that it can withstand subsequent processing, handling, usage and the like. Also, its durability and stability can be increased by cladding and encapsulating or otherwise protecting sensitive constituent materials.

In FIG. 4, the TE materials 403 and 409 may themselves be layers of heterostructure TE materials as in FIGS. 1, 3, 5, and 6.

Figure 5:
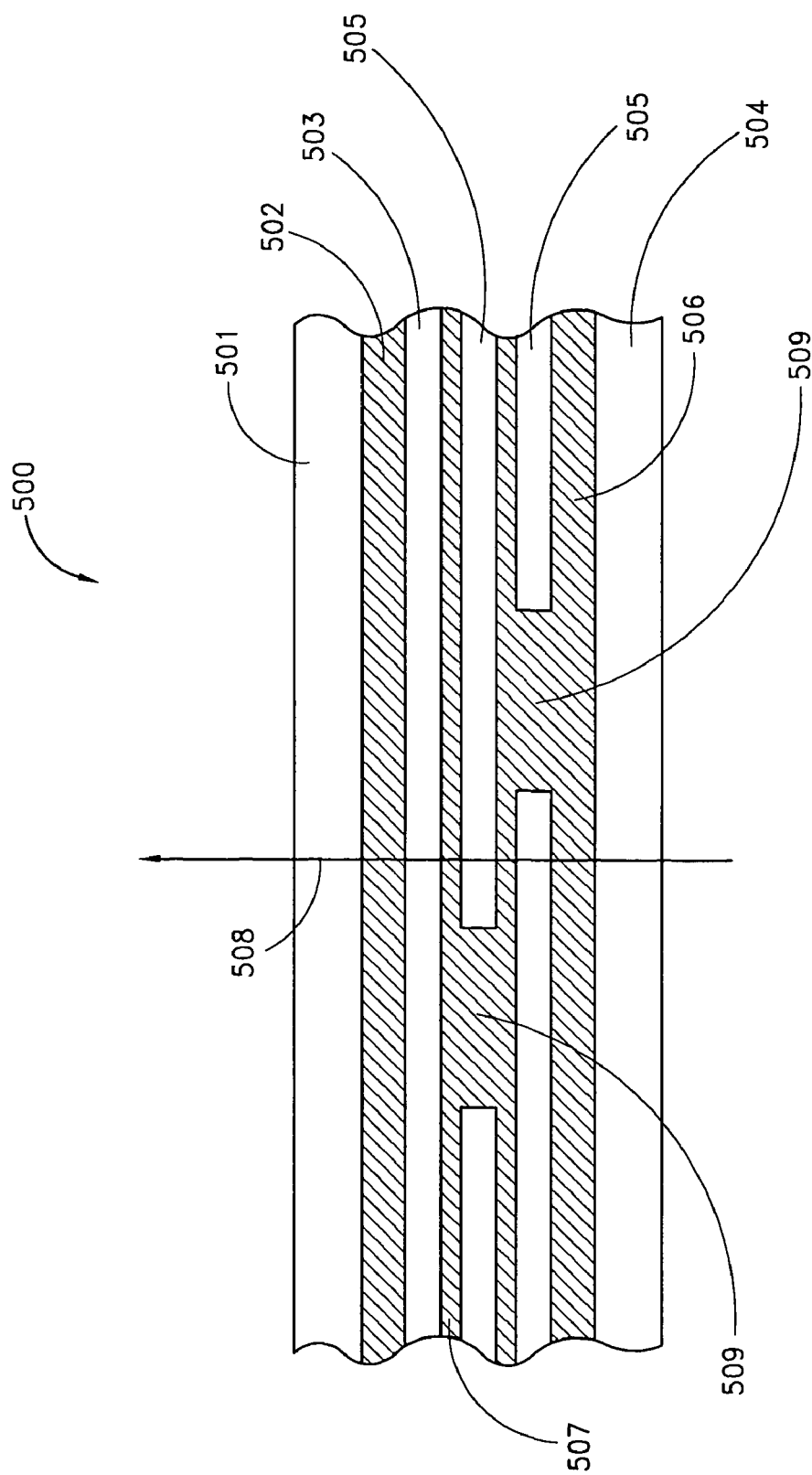
FIG. 5 illustrates a thermoelectric element portion of a heterostructure.

FIG. 5 depicts a TE element portion 500 formed of heterostructure thermoelectric material or thin film layers of thermoelectric material with a first electrode 501, bonding materials 502, 506 and 507, TE plates 503 and 505, and a second electrode 504. The TE plates 505 have gaps 509 due to defects or manufacturing tolerances of the TE plates 503 and 505, joints between the plates, or the assembly of many small TE plates into a larger array or the like. Advantageously, the TE plates 503 and 505 are heterostructures of TE material and the bonding materials 502, 506, 507 generally cover the surfaces of the TE plates 503 and 505, fill the gaps 509 and electrically connect the plates in the direction of current flow 508. The bonding materials 502, 506 and 507 can be made of multiple materials as discussed in the description of FIGS. 2 and 3. In this embodiment, the bonding materials 502, 506 and 507 should have moderate to very high electrical and thermal conductivity. If many gaps 509 exist, electrical conductivity of the bonding materials at 506 and 507 and between the stacked plates 503 and 505 should be moderate. In this case, conductivity should not be so high and bonding material thickness so great that significant current flow 508 is shunted through the gaps 509 in the plates 505 rather than through the TE plates.

Figure 6:
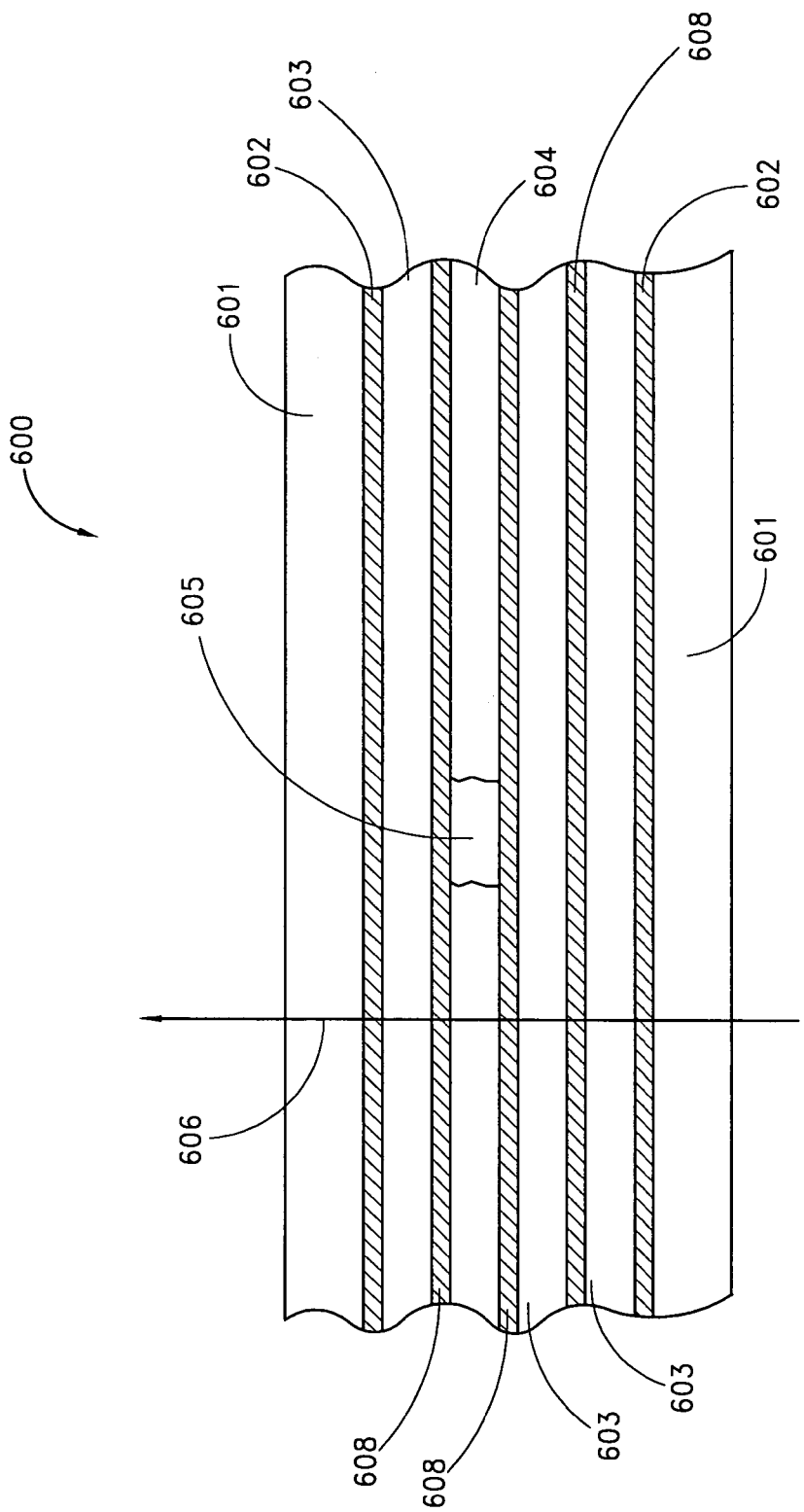
FIG. 6 illustrates a thermoelectric element portion.

FIG. 6 depicts a TE element portion 600 with electrodes 601, intermediate materials 602, TE plates 603 and 604, and gap 605 in a TE plate 604. In addition, bonding materials 608 are depicted between the TE heterostructure layers 603, 604.

As in FIGS. 3, 4 and 5, current 606 passes through the TE element portion 600 generally upward. In this design, two features are presented. First, the TE plates 603 and 604 are fabricated with an outer layer, not shown, that when processed by heat and pressure or other suitable means, causes the plates 603 and 604 to adhere to one another so as to allow current to pass generally uniformly and with very low electrical resistance through the entire TE element 600. Alternately, and as shown in FIG. 6, bonding material 608 can be used to the heterostructure layers 603 and 604. The intermediate materials 602 make similar low electrical and thermal resistance connections to the electrodes 601. Second, if the gaps 605 occur sufficiently infrequently in the TE element 600, no special provisions need be incorporated to enhance current flow in them. Similarly, the intermediate material could be omitted if the bond characteristics between the electrodes 601 and plates 603 are suitable for the conditions discussed related to FIG. 6. Advantageously the TE layers 603, 604 are heterostructure thermoelectric material or thin layers of thermoelectric material.

Figure 7:
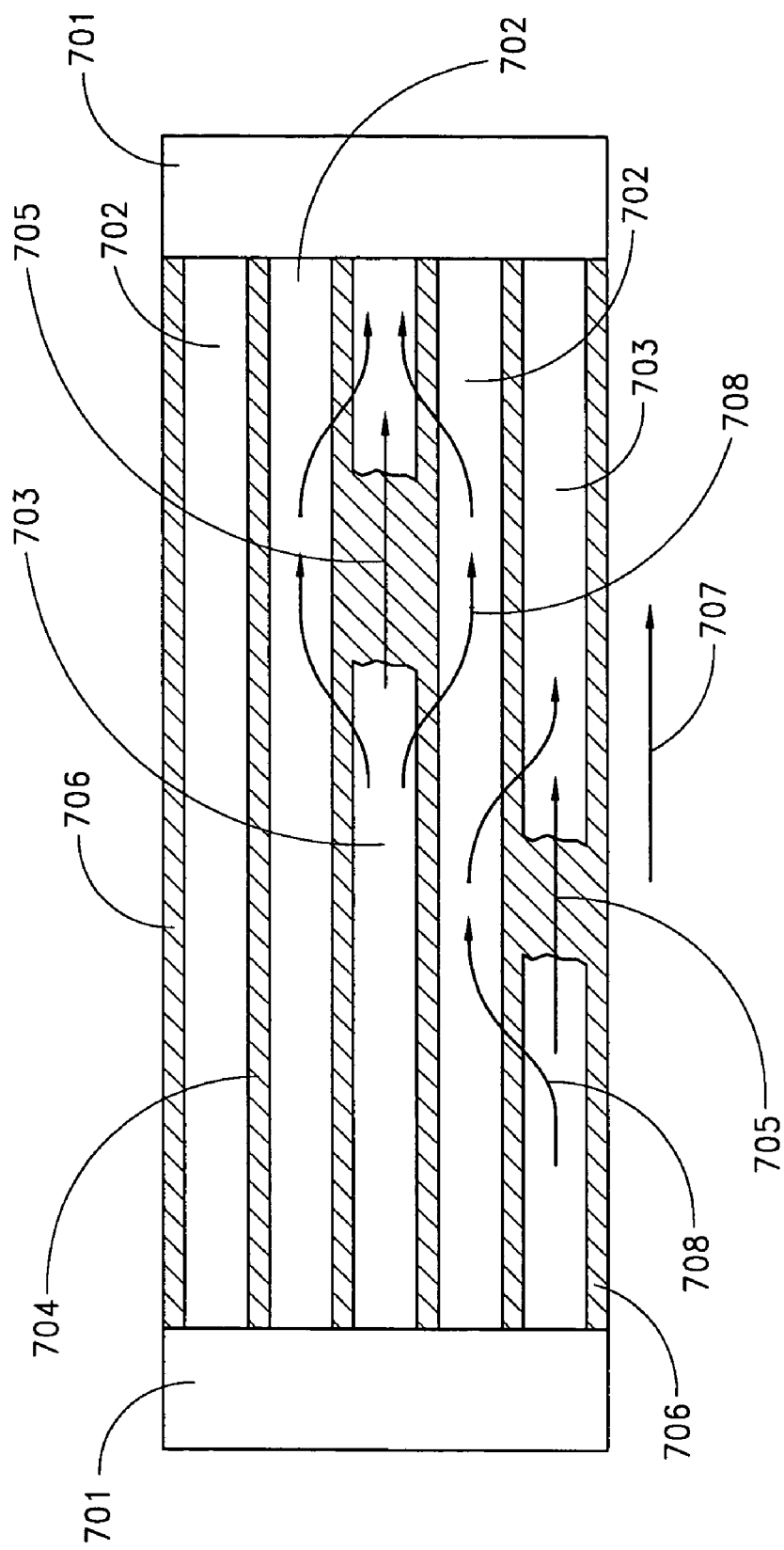
FIG. 7 illustrates another thermoelectric element.

FIG. 7 depicts a TE element 700 with electrodes 701, heterostructure TE plates 702, 703, and bonding materials 704, 706. The current 707 flows generally parallel to a long dimension of the plates 702 and 703. In this configuration, if either a significant number of gaps 705 (or breaks) in the heterostructure plates 703 are present or the number of plates 702 and 703 in the stack is small and some gaps 705 or breaks exist, the current 707 will be diverted by the gaps 705, unless the bonding material 704 and 706 (1) fills the gaps 705, (2) possesses the appropriate degree of electrical conductivity, (3) makes good electrical contact between the gaps 705 and the conductive layers that comprise part of the plates 703, and (4) does not contribute significantly to overall electrical and thermal losses in the TE element. Advantageously, distortion of the current flow 708 can be minimized by utilizing a bonding material 704 with electrical and thermal conductivity somewhat lower than that of the TE plates 702 and 703 in the direction of current flow 707. The bonding materials 706 and 704 need to be thin enough or otherwise configured so that they do not contribute significantly to the TE elements' 601 overall electrical or thermal conductivity and thereby reduce TE efficiency.

If the gaps 705 occur sufficiently infrequently, the bonding material 704 and 706 need not fill the gaps 705, and only need to provide electrical continuity between adjacent plates 702 and 703 so that the current 708 can be accommodated without significant distortion from the infrequent gaps 705 or breaks, as was discussed in the description of FIG. 6.

The TE plates 702, 703 may also be formed of thin layers of thermoelectric material. As mentioned above, the bonding material is also advantageously selected to reduce the shear stresses in the element. For example, flexible or otherwise resilient bonding material may be advantageous in some circumstances.

Table 1 presents a summary of the advantageous characteristics of sleeve, bonding material and intermediate materials. Notwithstanding the guidance presented in Table 1, other considerations or alternative design details may alter the teachings. Thus, Table 1 does not limit the scope of the present invention, but serves instead to give general design guidance.

TABLE 1

| MATERIAL PARAMETER | DIRECTION OF CURRENT FLOW | | | | | | | |
|---|---|---|---|---|---|---|---|---|
| | Parallel | | | | Perpendicular | | | |
| | S | $BM_1$ | $BM_2$ | IM | S | $BM_1$ | $BM_2$ | IM |
| Thermal Conductivity | L | L | L | H | L | H | M | H |
| Electrical Conductivity | L | L | M | H | L | H | M | H |
| Thickness | L | L | L | OPT | L | OPT | L | OPT |

L = Low; M = Medium; H = High; OPT = Optional
S = Sleeve; $BM_1$ = Bonding Material insignificant gaps; $BM_2$ = Bonding Material significant gaps; IM = Intermediate Material It should be understood that the thickness of the intermediate and bonding materials is generally indicated to meet the desired thermal and electrical characteristics of these layers. As will be understood from the above description, both the thermal conductance and thermal conductivity of these materials is taken into account in selecting the thickness and other properties of these materials.

Although several examples of thermoelectric compositions using the heterostructures and binding concepts described herein, the above-described embodiments are merely illustrative and variations from these could be made. For example, thin layers of TE material could be used rather than heterostructures in any embodiment. Further, features described in any one figure could be combined with features of any other figure, if appropriate, to achieve an advantageous combination in a particular device. Such combinations are also the objects and teachings of the present invention. Accordingly, the invention is defined by the appended claims, wherein the terms used are given their ordinary and accustomed meaning with no particular or special definition attributed to those terms by the specification.

What is claimed is:

1. A thermoelectric element comprising:

a first heterostructure thermoelectric portion, a second heterostructure thermoelectric portion, and a third heterostructure thermoelectric portion, the first, second, and third heterostructure thermoelectric portions of the same conductivity type and electrically coupled in series to one another such that current flows from the first heterostructure thermoelectric portion to the second heterostructure thermoelectric portion to the third heterostructure thermoelectric portion;

a first bonding portion between the first and second heterostructure thermoelectric portions and which bonds to the first heterostructure thermoelectric portion and to the second heterostructure thermoelectric portion, wherein the current flows through the first bonding portion from the first heterostructure thermoelectric portion to the second heterostructure thermoelectric portion and the first bonding portion comprises a flexible bonding material that is configured to not transmit significant shear stresses in the first and second heterostructure thermoelectric portions;

a second bonding portion between the second and third heterostructure thermoelectric portions and which bonds to the second heterostructure thermoelectric portion and to the third heterostructure thermoelectric portion, wherein the current flows through the second bonding portion from the second heterostructure thermoelectric portion to the third heterostructure thermoelectric portion and the second bonding portion comprises the flexible bonding material; and an electrically conductive material in electrical communication with the first and third heterostructure thermoelectric portions.

2. The thermoelectric element of claim 1, wherein the electrically conductive material comprises at least one electrode.

3. The thermoelectric element of claim 1, wherein the first, second, and third heterostructure thermoelectric portions form layers.

4. The thermoelectric element of claim 3, wherein the electrically conductive material is coupled to the layers at least one end of the layers.

5. The thermoelectric element of claim 3, wherein the electrically conductive material is coupled to at least the top or bottom of the layers.

6. The thermoelectric element of claim 1, wherein the first, second, and third heterostructure thermoelectric portions form wires.

7. The thermoelectric element of claim 6, wherein the electrically conductive material comprises at least one electrode.

8. The thermoelectric element of claim 7, wherein the electrically conductive material is coupled to the wires at least one end of the wires.

9. The thermoelectric element of claim 7, wherein the electrically conductive material is coupled to at least the top or bottom of the wires.

10. The thermoelectric element of claim 1, wherein the bonding material is configured to reduce the power density of the thermoelectric.

11. The thermoelectric element of claim 1, further comprising an intermediate material between at least one of the first and second heterostructure thermoelectric portions and the electrically conductive material.

12. The thermoelectric element of claim 11, wherein the intermediate material is configured to reduce shear stress in the first and second heterostructure thermoelectric portions when the thermoelectric element is operated.

13. The thermoelectric element of claim 12, wherein the intermediate material is resilient.

14. The thermoelectric element of claim 1, wherein the first, second, and third heterostructure thermoelectric portions are of substantially the same thermoelectric material.

15. The thermoelectric element of claim 1, wherein at least one of the first, second, and third heterostructure thermoelectric portions comprises at least two layers of heterostructure thermoelectric material.

16. The thermoelectric element of claim 1, wherein the current flows perpendicular to a long dimension of the first, second, and third heterostructure thermoelectric portions.

17. The thermoelectric element of claim 1, wherein the current flows parallel to a long dimension of the first, second, and third heterostructure thermoelectric portions.

18. A thermoelectric element comprising:

first, second, and third layers of substantially the same heterostructure thermoelectric material and of the same conductivity type and electrically coupled in series to one another such that current flows from the first layer to the second layer to the third layer;

a first bonding portion between the first and second layers and which bonds to the first layer and to the second layer, wherein the current flows through the first bonding portion from the first layer to the second layer and the first bonding portion comprises a flexible bonding material that is configured to not transmit significant shear stresses in the first and second layers;

a second bonding portion between the second and third layers and which bonds to the second layer and to the third layer, wherein the current flows through the second bonding portion from the second layer to the third layer and the second bonding portion comprises the flexible bonding material;

at least one electrically conductive material in electrical communication with the thermoelectric material.

19. The thermoelectric element of claim 18, wherein the electrically conductive material comprises at least one electrode.

20. The thermoelectric element of claim 18, wherein the electrically conductive material is coupled to the layers at least one end of the layers.

21. The thermoelectric element of claim 18, wherein the electrically conductive material is coupled to at least the top or bottom of the layers.

22. The thermoelectric element of claim 18, wherein the layers form wires.

23. The thermoelectric element of claim 22, wherein the electrically conductive material comprises at least one electrode.

24. The thermoelectric element of claim 23, wherein the electrically conductive material is coupled to the wires at least one end of the wires.

25. The thermoelectric element of claim 23, wherein the electrically conductive material is coupled to at least the top or bottom of the wires.

26. The thermoelectric element of claim 18, wherein the flexible bonding material is configured to reduce the power density of the thermoelectric element.

27. The thermoelectric element of claim 18, further comprising an intermediate material between the at least one electrically conductive material and at least one of the layers of the thermoelectric material.

28. The thermoelectric element of claim 27, wherein the intermediate material is configured to reduce shear stress in the layers when the thermoelectric element is operated.

29. The thermoelectric element of claim 27, wherein the intermediate material is resilient.

30. The thermoelectric element of claim 18, wherein the layers are heterostructures of bismuth/tellurium/selenium mixtures.

31. The thermoelectric element of claim 18, wherein at least one of the first, second, and third layers comprises at least two layers of heterostructure thermoelectric material.

32. A method of producing a thermoelectric device, the method comprising:

layering first, second, and third heterostructure thermoelectric segments to be electrically coupled in series to one another such that current flows from the first heterostructure thermoelectric segment to the second heterostructure thermoelectric segment to the third heterostructure thermoelectric segment;

bonding said first and second heterostructure thermoelectric segments with a flexible bonding material, wherein the flexible bonding material is between said first and second heterostructure thermoelectric segments and bonds to the first heterostructure thermoelectric segment and to the second heterostructure thermoelectric segment such that the flexible bonding material is configured to not transmit significant shear stresses in the first and second heterostructure thermoelectric segments, and wherein the current flows from the first heterostructure thermoelectric segment, through the flexible bonding material, to the second heterostructure thermoelectric segment;

bonding said second and third heterostructure thermoelectric segments with the flexible bonding material, wherein the flexible bonding material is between said second and third heterostructure thermoelectric segments and bonds to the second heterostructure thermoelectric segment and to the third heterostructure thermoelectric segment, and wherein the current flows from the second heterostructure thermoelectric segment, through the flexible bonding material, to the third heterostructure thermoelectric segment; and connecting at least one electrode to the segments.

33. The method of claim 32, further comprising providing an intermediate material between at least one of the heterostructure thermoelectric segments and the at least one electrode.

34. The method of claim 33, wherein said flexible bonding and intermediate materials are configured to decrease power density.

35. The method of claim 32, wherein the connecting comprises connecting electrodes at the ends of the segments.

36. The method of claim 32, wherein the connecting comprises connecting electrodes at the top and bottom of the segments.

37. A method of producing a thermoelectric device comprising:

forming first, second, and third layers of substantially the same heterostructure thermoelectric material such that the first, second, and third layers are electrically coupled in series to one another allowing current to flow from the first layer to the second layer to the third layer;

bonding said first and second layers with a flexible bonding material, wherein the flexible bonding material is between said first and second layers and bonds to the first layer and to the second layer such that the flexible bonding material is configured to not transmit significant shear stresses in the first and second layers, and wherein the current flows from the first layer, through the flexible bonding material, to the second layer;

bonding said second and third layers with the flexible bonding material, wherein the flexible bonding material is between said second and third layers and bonds to the second layer and to the third layer, and wherein the current flows from the second layer, through the flexible bonding material, to the third layer; and connecting at least one electrode to at least one of the layers.

38. The method of claim 37, wherein said flexible bonding material is configured to decrease power density.

39. The method of claim 37, wherein the connecting comprises connecting electrodes at the ends of the layers.

40. The method of claim 37, wherein the connecting comprises connecting electrodes at the top and bottom of the layers.

41. A thermoelectric element comprising:

a first heterostructure thermoelectric portion, a second heterostructure thermoelectric portion, and a third heterostructure thermoelectric portion, the first, second, and third heterostructure thermoelectric portions of the same conductivity type and electrically coupled in series to one another such that current flows from the first heterostructure thermoelectric portion to the second heterostructure thermoelectric portion to the third heterostructure thermoelectric portion; and a first bonding portion between the first and second heterostructure thermoelectric portions and which bonds to the first heterostructure thermoelectric portion and to the second heterostructure thermoelectric portion, wherein the bonding portion comprises a flexible bonding material that is configured to not transmit significant shear stresses in the first and second heterostructure thermoelectric portions and is thermally insulating; and a second bonding portion between the second and third heterostructure thermoelectric portions and which bonds to the second heterostructure thermoelectric portion and to the third heterostructure thermoelectric portion, wherein the bonding portion comprises the flexible bonding material.

42. The thermoelectric element of claim 41, wherein the flexible bonding material comprises an unfilled epoxy.

* * * * *

UNITED STATES PATENT AND TRADEMARK OFFICE
CERTIFICATE OF CORRECTION

PATENT NO. : 7,932,460 B2
APPLICATION NO. : 10/897292
DATED : April 26, 2011
INVENTOR(S) : Bell It is certified that error appears in the above-identified patent and that said Letters Patent is hereby corrected as shown below:

TITLE PAGE, ITEM (56)

In Issued Patent, under Other Publications, Page 3, Column 1, Line 47, change "$A1SbC^6{}_2$" to --$A1SbC^6_2$--.

On Page 3 at Item 56, Column 1, Line 55, under Other Publications, change " $Bi2Te3\star$", " to -- $Bi2Te3^{*}$", --.

On Page 3 at Item 56, Column 1, Line 63, under Other Publications, change "Ternaru" to --Ternary--.

On Page 3 at Item 56, Column 1, Line 65, under Other Publications, change "(Pbl-xGex)Te" to --(Pb1-xGex)Te--.

On Page 3 at Item 56, Column 2, Line 12, under Other Publications, change "Laboratorie s," to --Laboratories,--.

On Page 3 at Item 56, Column 2, Line 19, under Other Publications, change "oj" to --on--.

On Page 3 at Item 56, Column 2, Line 20, under Other Publications, change "Bi2 Te3" to --Bi2Te3--.

On Page 3 at Item 56, Column 2, Line 25, under Other Publications, change "IV VI-IVI2" to --IV VI-IV VI2--.

On Page 3 at Item 56, Column 2, Line 34, under Other Publications, change "Pb1-xlnxTe" to --Pb1-xInxTe--.

Signed and Sealed this
First Day of November, 2011

David J. Kappos
*Director of the United States Patent and Trademark Office*

CERTIFICATE OF CORRECTION (continued)
U.S. Pat. No. 7,932,460 B2

On Page 3 at Item 56, Column 2, Line 68, under Other Publications, change "Thernoelectric" to --Thermoelectric--.

On Page 4 at Item 56, Column 1, Line 17, under Other Publications, change "p-tupe" to --p-type--.

On Page 4 at Item 56, Column 1, Line 53, under Other Publications, change "Bi2 Te3" to --Bi2Te3--.

On Page 4 at Item 56, Column 2, Line 3, under Other Publications, change "loffe" to --Ioffe--.

On Page 4 at Item 56, Column 2, Line 19, under Other Publications, change "naostructuring" to --nanostructuring--.

On Page 4 at Item 56, Column 2, Line 51, under Other Publications, change " $90°\ K\star$ ", " to -- $90°K^{*}$ ", --.

In Column 1, Line 30, change "arise," to --arise--.

In Column 3, Line 37, change "thermoelectric" to --a thermoelectric--.

In Column 9, Line 25, In Claim 4, change "at" to --at at--.

In Column 9, Line 37, In Claim 8, change "at" to --at at--.

In Column 10, Line 26, In Claim 20, change "at" to --at at--.

In Column 10, Line 37, In Claim 24, change "at" to --at at--.